US012522910B2

(12) United States Patent
Shen et al.

(10) Patent No.: US 12,522,910 B2
(45) Date of Patent: Jan. 13, 2026

(54) PREPARATION METHOD FOR GRADIENT NEAR-EQUIAXED CRYSTAL Cr COATING ON THE SURFACE OF ZIRCONIUM ALLOY CLADDING

(71) Applicant: SHANGHAI JIAOTONG UNIVERSITY, Shanghai (CN)

(72) Inventors: Zhao Shen, Shanghai (CN); Yiheng Wu, Shanghai (CN); Zhexin Cui, Shanghai (CN); Yahuan Zhao, Shanghai (CN); Xiaoqin Zeng, Shanghai (CN)

(73) Assignee: SHANGHAI JIAOTONG UNIVERSITY, Shanghai (CN)

(*) Notice: Subject to any disclaimer, the term of this patent is extended or adjusted under 35 U.S.C. 154(b) by 0 days.

(21) Appl. No.: 19/211,264

(22) Filed: May 18, 2025

(65) Prior Publication Data

US 2025/0277300 A1 Sep. 4, 2025

(30) Foreign Application Priority Data

Jun. 5, 2024 (CN) ........................ 202410723483.1

(51) Int. Cl.
*C23C 14/16* (2006.01)
*C23C 14/02* (2006.01)
(Continued)

(52) U.S. Cl.
CPC ............ *C23C 14/16* (2013.01); *C23C 14/021* (2013.01); *C23C 14/028* (2013.01); *C23C 14/35* (2013.01); *C23C 14/542* (2013.01)

(58) Field of Classification Search
CPC ..... C23C 14/16; C23C 14/021; C23C 14/028; C23C 14/35; C23C 14/542
See application file for complete search history.

(56) References Cited

U.S. PATENT DOCUMENTS

2009/0220777 A1* 9/2009 Sporn ..................... C23C 14/34 204/192.15
2022/0372610 A1* 11/2022 Carpenter ............. C23C 14/165

FOREIGN PATENT DOCUMENTS

CN 108796454 A 11/2018
CN 114657510 A * 6/2022 ............. C23C 14/35
CN 114855123 A 8/2022

OTHER PUBLICATIONS

CN-114657510-A Translation (Year: 2022).*
(Continued)

*Primary Examiner* — Patrick S Ott
(74) *Attorney, Agent, or Firm* — Addison D. Ault; IPGentleman Intellectual Property Services, LLC

(57) ABSTRACT

A preparation method for a gradient near-equiaxed crystal Cr coating on the surface of a zirconium alloy cladding is described. According to the present invention, a high-power impulse magnetron sputtering technology is adopted, and by self-modification of HiPIMS equipment, argon gas is introduced into a zirconium alloy cladding tube, the flow rate of the argon gas in the tube is controlled to regulate and control the tube wall temperature, parameters such as bias voltage, target-substrate distance, sputtering pressure and the like are comprehensively controlled to obtain a pure Cr near-equiaxed crystal coating on the surface of the zirconium alloy with three-layer gradient structure grains. The coating has good toughness and can improve the high-temperature oxidation resistance of the zirconium alloy cladding, significantly enhancing the ability of the cladding to resist serious accidents of the reactor.

7 Claims, 4 Drawing Sheets

(51) Int. Cl.
*C23C 14/35* (2006.01)
*C23C 14/54* (2006.01)

(56) References Cited

OTHER PUBLICATIONS

Zhang, et al., A comprehensive experiments and calculations on the Cr/Zr interface behaviour of Cr coated Zr cladding, 2022, Applied Surface Science, 604, 154520 (Year: 2022).*
Luan, Baifeng et al., CN114855123A, Aug. 5, 2022 English Machine Translation, pp. 1-15.
Yang, Hongyan et al., CN108796454A, Nov. 13, 2018 English Machine Translation, pp. 1-19.
CNIPA 'Notice of First Examination Opinion', Application No. 202410723483.1, dated Sep. 26, 2024, Chinese original, pp. 1-8.
CNIPA 'Notice of First Examination Opinion', Application No. 202410723483.1, dated Sep. 26, 2024, English translation, pp. 1-8.
CNIPA Notice of Granting Invention Patent Rights, Application No. 202410723483.1, dated Nov. 25, 2024, Chinese original, pp. 1-4.
CNIPA Notice of Granting Invention Patent Rights, Application No. 202410723483.1, dated Nov. 25, 2024, English translation, pp. 1-4.

* cited by examiner

PREPARATION METHOD FOR GRADIENT NEAR-EQUIAXED CRYSTAL Cr COATING ON THE SURFACE OF ZIRCONIUM ALLOY CLADDING

CROSS-REFERENCE TO RELATED APPLICATIONS

This application claims priority to Chinese Patent Application No. 202410723483.1, filed with the China National Intellectual Property Administration on Jun. 5, 2024 and entitled "Preparation Method for Gradient Near-equiaxed Crystal Cr Coating on the Surface of Zirconium Alloy Cladding", which is incorporated herein by reference in its entirety.

TECHNICAL FIELD

The invention belongs to the technical field of a nuclear fuel cladding surface coating, and in particular relates to a preparation method for a gradient near-equiaxed crystal Cr coating on the surface of a zirconium alloy cladding.

BACKGROUND

Benefiting from good oxidation resistance, neutron irradiation resistance, high hardness, excellent ductility and extremely low thermal neutron absorption cross section, zirconium alloy has been used as a cladding material for $UO_2$ fuel as early as 1950 and has been used ever since. However, under water loss accident conditions, once the cooling water cannot be supplied in time, the reactor core temperature will rise sharply. The zirconium alloy and water vapor will undergo an oxidation reaction in a high-temperature environment to produce hydrogen gas and release a large amount of heat, which can easily lead to catastrophic consequences such as hydrogen explosion and large-scale leakage of radioactive substances. Therefore, it is necessary to improve the resistance of zirconium alloy claddings to high-temperature steam oxidation.

The development of coating materials is currently one of the key means to improve the high temperature oxidation resistance of zirconium alloy claddings, and is also one of the means most likely to achieve engineering applications. Among the numerous coating materials, pure Cr coating is currently the most widely studied candidate material with great application potential. As a coating material for accident-tolerant fuel claddings, Cr has significant advantages such as high melting point, high thermal conductivity, strong resistance to high-temperature oxidation, and similar thermal expansion coefficient to zirconium alloy. However, the Cr coating prepared by traditional physical vapor deposition technology usually has a columnar crystal structure, which has poor toughness and is prone to brittle cracking along the vertical grain boundaries of the columnar crystals when oxidized in a high-temperature steam environment, resulting in the attenuation or even loss of the protective performance of the coating. Therefore, it is urgent to provide a preparation method for a Cr coating suitable for zirconium alloy to improve its toughness, thereby effectively improving the ability of zirconium alloy fuel claddings to resist severe accidents.

SUMMARY

In view of the above-mentioned problems existing in the prior art, the present invention proposes a preparation method for a gradient near-equiaxed crystal Cr coating on the surface of a zirconium alloy cladding.

In order to achieve the above objects, the present invention provides the following technical solutions:

A gradient near-equiaxed crystal Cr coating on the surface of a zirconium alloy cladding, wherein the coating has a near-equiaxed crystal characteristic and is divided into three layers, and has a total thickness of 10-15 μm, wherein a first coating (the coating in contact with a substrate is a "first coating", and the coatings toward the air side are a "second coating" and a "third coating" in order) has a grain size of 0.1-0.3 μm and a thickness of 5.0-7.0 μm; the second coating has a grain size of 1-2 μm and a thickness of 4.5-6.8 μm; the third coating has a grain size of 0.1-0.3 μm and a thickness of 0.5-1.2 μm.

The present invention also provides a preparation method for a gradient near-equiaxed crystal Cr coating on the surface of a zirconium alloy cladding, comprising the following steps:

the pretreated zirconium alloy substrate is subjected to target pre-sputtering treatment and argon plasma etching treatment, and then a Cr coating is sputtered to obtain the gradient near-equiaxed crystal Cr coating on the surface of the zirconium alloy cladding;

wherein during the process of sputtering the Cr coating, a three-layer coating with different grain sizes having a gradient near-equiaxed crystal structure characteristic is obtained by the following strategy. In actual applications, the adjustment of one parameter will affect that all parameters will change. Therefore, it is not possible to obtain the target product by changing only a single variable, but rather to coordinate and adjust as a whole:

A. Regulating the bias voltage: when preparing the first coating or the third coating, the bias voltage is regulated to −110~−120 V (including −110 V); when preparing the second coating, the bias voltage is regulated to −90V~−110 V (excluding −110 V);

B. Regulating the target-substrate distance: when preparing the first coating or the third coating, the target-substrate distance is 15-20 cm; when preparing the second coating, the target-substrate distance is 10-15 cm.

C. Regulating the sputtering pressure: when preparing the first coating or the third coating, the sputtering pressure is 0.2-0.6 Pa; when preparing the second coating, the sputtering pressure is 0.6-1.0 Pa;

D. Regulating the argon gas flow rate in the tube and tube wall temperature: when preparing the first coating or the third coating, the argon gas flow rate into the tube is controlled to 25-50 sccm, so that the tube wall temperature is regulated to 150-260° C.; when preparing the second coating, the argon gas flow rate into the tube is controlled to 10-25 sccm, so that the tube wall temperature is regulated to 260-420° C.

Further, the total deposition time of the three coatings is 5-15 h. When sputtering the first coating, the deposition time is 2.5-8 h; when sputtering the second coating, the deposition time is 2-6 h; when sputtering the third coating, the deposition time is 0.5-1 h.

Further, the pretreatment method is as below: 400 #, 800 #, 1200 #, 2000 #, 3000 # and 4000 # sandpapers are used to polish the surface of the zirconium alloy substrate in sequence, and then 9 μm, 3 μm and 1 μm diamond suspensions are used to polish the surface of the zirconium alloy substrate in sequence; finally, the sample is immersed in an acetone solution and ultrasonically cleaned for 10-20 min, taken out and oven-dried, and placed in a vacuum box for later use.

Further, the parameters of the target pre-sputtering treatment are as below: the temperature of the chamber of the magnetron sputtering instrument is 200-350° C., the chamber vacuum degree is $3\times10^{-4}$-$5\times10^{-4}$ Pa, high-purity argon is introduced so that the chamber pressure is 0.8-1.5 Pa, the power is 200-500 W, and the sputtering time is 10-25 min.

Further, during the process of the argon plasma etching treatment: the temperature is 200-350° C., the argon gas flow rate is 40-60 sccm, the ion source current is 0.5-2 A, the bias voltage is −50~−200 V, and the etching time is 10-30 min.

Further, during the process of sputtering the Cr coating: the pulse frequency is 200-500 Hz, the pulse width is 20-80 μs, the duty cycle is 1%-4%, the sputtering power is 2000-4000 W, the deposition temperature is 150-420° C., and the deposition time is 5-15 h.

In the preparation process of the coating according to the present invention, a high power impulse magnetron sputtering self-modified device (as shown in FIG. 1) is used. The device accurately controls the grain morphology and size of the plated pure Cr coating by adding an Ar gas flow rate control system and a target-substrate distance dynamic adjustment system in the zirconium alloy tube.

An application of the gradient near-equiaxed crystal Cr coating on the surface of the zirconium alloy cladding in improving the high-temperature service performance of a zirconium alloy cladding tube.

Compared with the prior art, the present invention has the following advantages and technical effects:

The present invention relates to a novel accident-tolerant zirconium alloy cladding surface coating, which comprises pure chromium as the main component and presents a gradient near-equiaxed crystal structure. Since pure chromium has excellent corrosion resistance, the near-equiaxed crystal coating coated on the surface of the zirconium alloy cladding can significantly improve the material's resistance to high-temperature steam corrosion, thereby improving the tolerance of the zirconium alloy cladding under severe conditions, reducing the corrosion rate and extending the service life. The unique structure of the pure Cr near-equiaxed crystal coating enables it to have good toughness (elongation of the columnar crystal is 0.4%, elongation of the near-equiaxed crystal can reach 3.0%), excellent stability, good thermal conductivity, and provide a more uniform distribution of mechanical properties under high temperature environment (after testing, the pure Cr coating zirconium alloy having the gradient near-equiaxed crystal structure is subjected to a high temperature oxidation by water vapor at 1200° C. for 3600 s, and the oxide film and residual Cr coating do not peel off after oxidation, and there is no debonding phenomenon at the coating-substrate interface, and no Cr coating peeling phenomenon caused by thermal stress. The film-substrate bonding force is good, and the Cr coating still has the protective property for the zirconium alloy substrate), which helps to improve the service life and performance of the zirconium alloy cladding under high temperature conditions and enhance the accident tolerance of the zirconium alloy cladding.

The present invention adopts high power impulse magnetron sputtering technology and modifies the HiPIMS equipment to deposit a chromium coating with a thickness of 10-15 μm on the surface of the Zr-4 alloy. The thermal environment during the sputtering process is dynamic. When there is a sufficient temperature gradient in the preparation process of the coating to provide sufficient thermal undercooling, and to promote atomic diffusion through a high nucleation rate, the formation of near-equiaxed grains is induced. The present invention controls the deposition rate and cooling rate of the Cr coating by dynamically regulating parameters such as argon gas flow rate in the sample tube (i.e., regulating the tube wall temperature), bias voltage, target-substance distance, and sputtering pressure during the sputtering process, thereby obtaining a gradient near-equiaxed crystal Cr coating with grain sizes of 0.1-0.3 μm, 1-2 μm, and 0.1-0.3 μm, respectively. The grains of the coating close to the zirconium alloy substrate are smaller (the grain size is 0.1-0.3 μm), and as the distance from the zirconium alloy increases, the grain size increases (the grain size is 1-2 μm), and the coating surface is composed of a layer of fine and dense fine crystals (grain size is 0.1-0.3 μm). This gradient near-equiaxed crystal structure can significantly improve the toughness of the zirconium alloy coating, avoid debonding and peeling during high-temperature oxidation, and ensure its integrity during the service. At the same time, the fine and dense Cr on the surface will preferentially react with oxygen to form a dense layer of $Cr_2O_3$, which can significantly inhibit the diffusion of oxygen. The larger equiaxed grains in the middle layer ensure the thermal conductivity of the material and ensure that it can operate under normal working conditions. The fine Cr grains in contact with the substrate again act as a barrier to prevent oxygen from diffusing into the zirconium alloy substrate. In addition, in the present invention, by means of regulating parameters such as argon gas flow rate in the sample tube (i.e., regulating the tube wall temperature), bias voltage, target-substrate distance, and sputtering pressure, gradient near-equiaxed crystal coatings with different thicknesses of each layer are obtained by depositing for different times. Considering that the Cr coating affects the circumferential and axial thermal expansion performances of the zirconium alloy tube, and that an excessively thick coating will increase the interface stress and cause cracking and other problems, while an excessively thin coating will not provide sufficient protection for the substrate, the present invention also limits the thickness of each layer of the gradient near-equiaxed crystal coating.

The Cr coating improves the toughness and high-temperature oxidation resistance of the zirconium alloy cladding, and can significantly enhance the ability of the fuel cladding to resist serious accidents of the reactor.

BRIEF DESCRIPTION OF THE DRAWINGS

The accompanying drawings constituting a part of this application are used for providing further understanding for this application. Exemplary embodiments of this application and descriptions thereof are used for explaining this application and do not constitute a limitation to this application. In the drawings.

DETAILED DESCRIPTION

Figure 1:
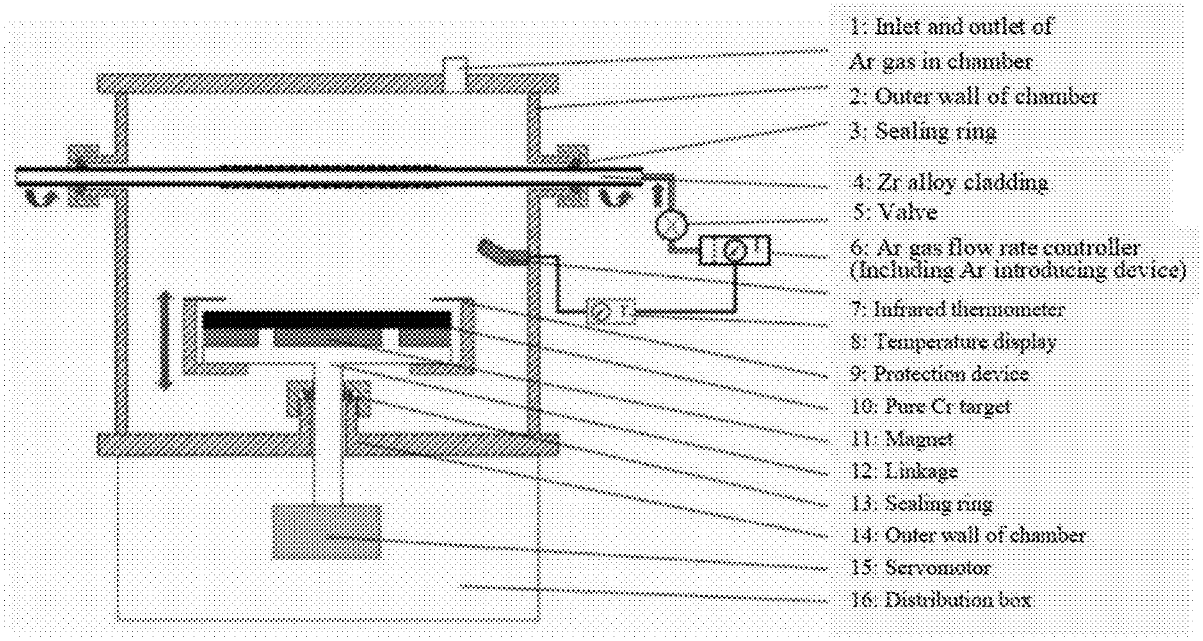
FIG. 1 is a schematic diagram of a high power impulse magnetron sputtering self-modified device.

Various exemplary embodiments of the present invention will now be described in detail, which should not be considered as limitations to the present invention, but rather as more detailed description for some aspects, features and implementations of the present invention.

It should be understood that terms in the present disclosure are merely used for describing special implementations, rather than limiting the present disclosure. Furthermore, the numerical range in the present disclosure should be construed as specifically disclosing each intermediate value between an upper limit and a lower limit of the range. Any stated value or intermediate value within the stated range and any other stated values or every smaller range within the stated range are also included in the present disclosure. The upper limit and lower limit of these smaller ranges may be included in or excluded from the range independently.

Unless otherwise specified, all technical and scientific terms used herein have the same meanings as commonly understood by those skilled in the art in the field of the present invention. Although the present invention describes only preferred methods and materials, any methods and materials similar or equivalent to those described herein can also be used in the implementation or testing of the present invention. All documents mentioned in this specification are incorporated by reference to disclose and describe methods and/or materials related to the documents. In case of conflict with any incorporated document, the contents of the present specification shall prevail.

It is obvious for those skilled in the art that many improvements and changes can be made to the specific embodiments of the present invention without departing from the scope or spirit of the present invention. Other implementations obtained from the specification of the present invention are obvious to those skilled. The specification and embodiments of the present invention are merely exemplary.

As used herein, the terms "comprise", "include", "have", "contain", and the like are all open terms, which means including but not limited to.

Unless otherwise specified, the "room temperature" described in the present invention is 20-30° C.

In the present invention, the high power impulse magnetron sputtering (HiPIMS) technology is adopted, and by modifying the HiPIMS device, argon gas is introduced into the zirconium alloy cladding tube and the flow rate of argon gas in the tube is controlled, and parameters such as bias voltage, target-substrate distance, sputtering pressure are regulated, so that a gradient near-equiaxed crystal Cr coating with grain sizes of 0.1-0.3 μm, 1-2 μm and 0.1-0.3 μm respectively is obtained by regulation and control. The grains of the gradient coating close to the zirconium alloy substrate are smaller (the grain size is 0.1-0.3 μm), and as the distance from the zirconium alloy increases, the grains gradually become larger (the grain size is 1-2 μm), and the coating surface is composed of a layer of fine and dense fine crystals (the grain size is 0.1-0.3 μm). The overall thickness of the pure Cr coating is 10-15 μm, wherein the first coating has a thickness of 5.0-7.0 μm, the second coating has a thickness of 4.5-6.8 μm, and the third coating has a thickness of 0.5-1.2 μm. The pure Cr gradient coating on the surface of the accident-tolerant zirconium alloy cladding designed by the present invention shows good toughness when oxidized in a high-temperature environment, and a dense $Cr_2O_3$ protective oxide film is generated on its surface, which improves the density and uniformity of the material surface, significantly inhibits the diffusion of oxygen, and thus improves its high-temperature oxidation resistance.

The specific technical solution is as follows: a gradient near-equiaxed crystal Cr coating on the surface of a zirconium alloy cladding, wherein the gradient coating has a near-equiaxed crystal characteristic, is divided into three layers, and has a total thickness of 10-15 μm. The grains of the coating close to the zirconium alloy substrate are smaller (the first coating has a grain size of 0.1-0.3 μm, and has a thickness of 5.0-7.0 μm). As the distance from the zirconium alloy increases, the grains gradually become larger (the second coating has a grain size of 1-2 μm, and has a thickness of 4.5-6.8 μm). The surface of the coating is composed of a layer of fine and dense fine crystals (the third coating has a grain size of 0.1-0.3 μm, and has a thickness of 0.5-1.2 μm).

The pure Cr near-equiaxed crystal coating has a better grain structure, which has better toughness and generates a dense layer of $Cr_2O_3$ on the surface when oxidized in a high-temperature environment, is not easy to peel off and crack, and ensures the integrity of the Cr coating on the surface of the zirconium alloy. It can significantly inhibit the diffusion of oxygen, improve the density and uniformity of the material surface, and thus improve its high-temperature oxidation resistance. At the same time, the gradient near-equiaxed crystal structure helps to improve the thermal stability of the material, making it more suitable for high-temperature working environments.

The present invention also provides a preparation method for the gradient near-equiaxed crystal Cr coating on the surface of the zirconium alloy cladding, which is a method for plating a Cr layer on a substrate material by a high power impulse magnetron sputtering process, comprising the following steps:

1) Pretreatment of the substrate: a Zr-4 alloy tube (the dimensions of which are as follows: outer diameter is 8.5-10.5 mm, thickness is 0.45-0.65 mm, length is 10-25 cm, and the components of which are as follows: Zr 98.0-98.5%, Sn 1.0-2.0%, Fc 0.2-0.3%, Cr 0.1-0.2%) is prepared; the sample surface is polished with 400 #, 800 #, 1200 #, 2000 #, 3000 # and 4000 # sandpapers in order; then, the sample surface is polished with 9 μm, 3 μm and 1 μm diamond suspensions; finally, the sample is immersed in an acetone solution and ultrasonically cleaned for 10-20 min, taken out and oven-dried, and then placed in a vacuum box for later use;
2) Substrate installation and target pre-sputtering treatment: the pre-treated sample is fixed on a sample table of a chamber of a magnetron sputtering instrument, the chamber of the magnetron sputtering instrument is heated to 200-350° C., the chamber is vacuumized to $3\times10^{-4}$-$5\times10^{-4}$ Pa, argon gas is introduced into the chamber of the magnetron sputtering instrument until the chamber pressure is 0.8-1.5 Pa, and a Cr target is pre-sputtered for 10-25 min at a power of 200-500 W;
3) Argon plasma etching treatment: the substrate is etched for 10-30 min under the conditions of a temperature of 200-350° C., an argon gas flow rate of 40-60 sccm, an ion source current of 0.5-2 A and a bias voltage of −50∼−200 V;
4) Sputtering Cr coating: a high-power impulse sputtering power supply is started, the pulse frequency is controlled to 200-500 Hz, the pulse width is controlled to 20-80 μs, the duty cycle is controlled to 1%-4%, and the sputtering power is controlled to 2000-4000 W. The following parameters are dynamically regulated: bias voltage is −90∼−120 V, target-substrate distance is 10-20 cm, sputtering pressure is 0.2-1.0 Pa, Ar gas flow rate in the tube is regulated to 10-50 sccm, deposition temperature is 150-420° C., deposition time of each layer of the coating is 0.5-8 h, total deposition time is 5-15 h, thickness of each layer of the coating is 0.5-7 μm, and total thickness of the coating is 10-15 μm. To control the grain size and thickness of each near-equiaxed crystal coating, in particular:

a. Sputtering the first coating: the bias voltage is controlled to −110~−120 V, the target-substrate distance is controlled to 15-20 cm, the sputtering pressure is controlled to 0.2-0.6 Pa, and through the infrared thermometer-Ar gas flow rate controller system, according to the real-time temperature monitoring data of the outer wall of the Zr-4 alloy tube, the Ar gas flow rate in the tube is actively and dynamically adjusted to 25-50 sccm, so that the outer wall temperature of the tube (i.e., the deposition temperature) is maintained at 150-260° C., and the deposition is performed for 2.5-8 h to obtain a fine and dense near-equiaxed crystal structure, i.e., the first coating;

b. Sputtering the second coating: the bias voltage is controlled to −90V~−110V, the Cr target is slowly moved within 1 min by controlling connecting rod with a servomotor, so that the target-substrate distance becomes 10-15 cm, and the sputtering pressure is controlled to 0.6-1.0 Pa, and through the infrared thermometer-Ar gas flow rate controller system, according to the real-time temperature monitoring data of the outer wall of the Zr-4 alloy tube, the Ar flow rate in the tube is actively and dynamically adjusted to 10-25 sccm, so that the outer wall temperature of the tube (i.e., the deposition temperature) is maintained at 260-420° C., and the deposition is performed for 2-6 h to obtain a larger size near-equiaxed crystal structure, i.e., the second coating;

c. Sputtering the third coating: the bias voltage is controlled to −110~−120 V, the Cr target is slowly moved within 1 min by controlling connecting rod with a servomotor, so that the target-substrate distance becomes 15-20 cm, and the sputtering pressure is controlled to 0.2-0.6 Pa, through the infrared thermometer-Ar gas flow rate controller system, according to the real-time temperature monitoring data of the outer wall of the Zr-4 alloy tube, the Ar gas flow rate in the tube is actively and dynamically adjusted to 25-50 sccm, so that the outer wall temperature of the tube (i.e., the deposition temperature) is maintained at 150-260° C., and the deposition is performed for 0.5-1 h to obtain a fine and dense near-equiaxed crystal structure, i.e., the third coating.

In order to obtain the coating with a specified grain morphology, grain size and thickness, the present invention strictly controls the range of parameter values such as bias voltage, target-substrate distance, sputtering pressure and Ar gas flow rate (deposition temperature) in the tube, so as to obtain the desired near-equiaxed crystal characteristic structure with a certain thickness gradient.

The raw materials used in the following examples of the present invention are all commercially available.

The following examples serve as further illustrations of the technical solutions of the present invention.

Example 1

A preparation method for a gradient near-equiaxed crystal Cr coating on the surface of a zirconium alloy cladding, comprising the following steps:

1) Pretreatment of the substrate: a Zr-4 alloy tube (the dimensions of which were as follows: the outer diameter was 9.5 mm, the thickness was 0.57 mm and the length was 20 cm, and the components of which were as follows: Zr 98.3%, Sn 1.3%, Fe 0.25% and Cr 0.15%) was prepared; the sample surface was polished with 400 #, 800 #, 1200 #, 2000 #, 3000 # and 4000 # sandpapers in order; then, the sample surface was polished with 9 μm, 3 μm and 1 μm diamond suspensions; finally, the sample was immersed in an acetone solution and ultrasonically cleaned for 15 min, taken out and oven-dried, and then placed in a vacuum box for later use;

2) Substrate installation and target pre-sputtering treatment: the pre-treated sample was fixed on a sample table of a chamber of a magnetron sputtering instrument, the chamber of the magnetron sputtering instrument was heated to 310° C., the chamber was vacuumized to $4\times10^{-4}$ Pa, argon gas was introduced into the chamber of the magnetron sputtering instrument until the chamber pressure was 1.0 Pa, and a Cr target was pre-sputtered for 15 min at a power of 400 W;

3) Argon plasma etching treatment: the substrate was etched for 25 min under the conditions of a temperature of 270° C., an argon gas flow rate of 50 sccm, an ion source current of 1.2 A and a bias voltage of −100 V;

4) Sputtering Cr coating: a high-power impulse sputtering power supply was started, the pulse frequency was controlled to 360 Hz, the pulse width was controlled to 80 μs, the duty cycle was controlled to 3%, the sputtering power was controlled to 2800 W. The following parameters were dynamically regulated: the bias voltage was −90~−120 V, the target-substrate distance was 10-20 cm, the sputtering pressure was 0.2-1.0 Pa, the Ar gas flow rate in the tube was regulated to 10-50 sccm, the deposition temperature was 150-420° C., the deposition time of each layer of the coating was 0.5-8 h, the total deposition time was 5-15 h, the thickness of each layer of the coating was 0.5-7 μm, the total coating thickness was 10-15 μm. The specific steps were as follows:

a. Sputtering the first coating: the bias voltage was controlled to −115 V, the target-substrate distance was controlled to 16 cm, the sputtering pressure was controlled to 0.4 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., deposition temperature) was maintained at 205-215° C., and the deposition was performed for 4 h to obtain a fine and dense near-equiaxed crystal structure, i.e., the first coating;

b. Sputtering the second coating: the bias voltage was controlled to −95 V, the Cr target was slowly moved within 1 min by controlling connecting rod with a servomotor, so that the target-substrate distance became 13 cm, and the sputtering pressure was controlled to 0.8 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 10-25 sccm, so that the outer wall temperature of the tube (i.e., the deposition temperature) was maintained at 305-325° C., and the deposition was performed for 3.5 h to obtain a larger size near-equiaxed crystal structure, i.e., the second coating;

c. Sputtering the third coating: the bias voltage was controlled to −115 V, the Cr target was slowly moved within 1 min by controlling connecting rod with a servomotor, so that the target-substrate distance became 16 cm, and the sputtering pressure was controlled to 0.4 Pa, through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 200-210° C., and the deposition was performed for 0.5 h to obtain a fine and dense near-equiaxed crystal structure, i.e., the third coating.

The total deposition time of this example was 8 h, and a zirconium alloy sample deposited with a Cr coating was obtained. After testing, the total thickness of the coating was 11.0 μm, wherein the thickness of the first coating was 5.3 μm, the thickness of the second coating was 5.0 μm, and the thickness of the third coating was 0.7 μm. The average grain size of the first coating was 0.15 μm, the average grain size of the second coating was 1.4 μm, and the average grain size of the third coating was 0.23 μm.

Figure 2:
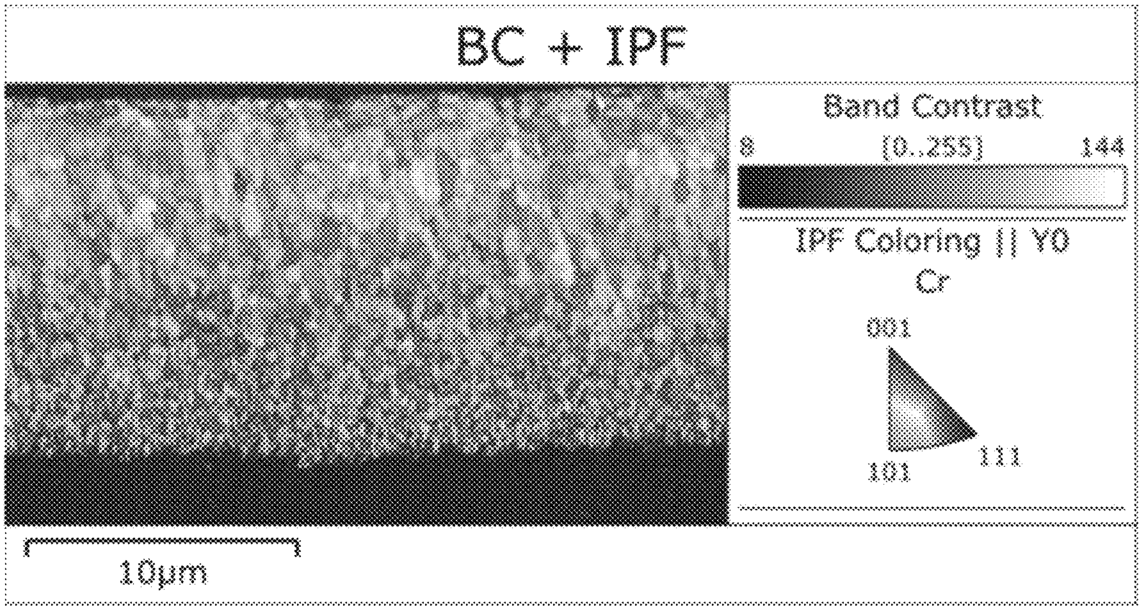
FIG. 2 is a BC+IPF diagram of a zirconium alloy sample deposited with a Cr coating prepared in Example 1.

FIG. 2 is a BC+IPF diagram of a zirconium alloy sample deposited with a Cr coating prepared in Example 1. It can be seen from the figure that the coating grains are nearly equiaxed in different sizes and are divided into three layers, the overall thickness of the coating is uniform and the surface thereof is flat; and that the film-substrate bonding force is strong, and the coating is not easy to peel off.

Example 2

A preparation method for a gradient near-equiaxed crystal Cr coating on the surface of a zirconium alloy cladding, comprising the following steps:

1) Pretreatment of the substrate: a Zr-4 alloy tube (the dimensions of which were as follows: the outer diameter was 9.5 mm, the thickness was 0.57 mm, the length was 20 cm, and the components of which were as follows: Zr 98.3%, Sn 1.3%, Fe 0.25%, Cr 0.15%) was prepared; the sample surface was polished with 400 #, 800 #, 1200 #, 2000 #, 3000 # and 4000 # sandpapers in order; then, the sample surface was polished with 9 μm, 3 μm and 1 μm diamond suspensions; finally, the sample was immersed in an acetone solution and ultrasonically cleaned for 20 min, taken out and oven-dried, and then placed in a vacuum box for later use.
2) Substrate installation and target pre-sputtering treatment: the pre-treated sample was fixed on a sample table of a chamber of a magnetron sputtering instrument, the chamber of the magnetron sputtering instrument was heated to 280° C., the chamber was vacuumized to $4\times10^{-4}$ Pa, argon gas was introduced into the chamber of the magnetron sputtering instrument until the chamber pressure was 1.2 Pa, and a Cr target was pre-sputtered for 20 min at a power of 350 W;
3) Argon plasma etching treatment: the substrate was etched for 20 min under the conditions of a temperature of 260° C., an argon gas flow rate of 45 sccm, an ion source current of 1.5 A, and a bias voltage of −110 V;
4) Sputtering Cr coating: a high-power impulse sputtering power supply was started, the pulse frequency was controlled to 320 Hz, the pulse width was controlled to 60 μs, the duty cycle was controlled to 2%, and the sputtering power was controlled to 2500 W. The following parameters were dynamically regulated: the bias voltage was −90~−120 V, the target-substrate distance was 10-20 cm, the sputtering pressure was 0.2-1.0 Pa, the Ar gas flow rate in the tube was regulated to 10-50 sccm, the deposition temperature was 150-420° C., the deposition time for each layer of the coating was 0.5-8 h, the total deposition time was 5-15 h, the thickness of each layer of the coating was 0.5-7 μm, the total coating thickness was 10-15 μm. The specific steps were as follows:
   a. Sputtering the first coating: the bias voltage was controlled to −120V, the target-substrate distance was controlled to 18 cm, the sputtering pressure was controlled to 0.5 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 195-205° C., and the deposition was performed for 6 h to obtain a fine and dense near-equiaxed crystal structure, i.e., the first coating;
   b. Sputtering the second coating: the bias voltage was controlled to −100 V, the Cr target was slowly moved within 1 min by controlling connecting rod with a servomotor, so that the target-substrate distance became 14 cm, and the sputtering pressure was controlled to 0.9 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 10-25 sccm, so that the outer wall temperature of the tube (i.e., the deposition temperature) was maintained at 300-320° C., and the deposition was performed for 5 h to obtain a larger size near-equiaxed crystal structure, i.e., the second coating;
   c. Sputtering the third coating: the bias voltage was controlled to −110 V, the Cr target was slowly moved within 1 min by controlling connecting rod with a servomotor, so that the target-substrate distance became 17 cm, and the sputtering pressure was controlled to 0.5 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 205-215° C., and the deposition was performed for 1 h to obtain a fine and dense near-equiaxed crystal structure, i.e., the third coating.

The total deposition time of this example was 12 h, and a zirconium alloy sample deposited with a Cr coating was obtained. After testing, the total thickness of the coating was 14.4 μm, wherein the thickness of the first coating was 6.5 μm, the thickness of the second coating was 6.7 μm, and the thickness of the third coating was 1.2 μm. The average grain size of the first coating was 0.12 μm, the average grain size of the second coating was 1.3 μm, and the average grain size of the third coating was 0.26 μm.

Example 3

A preparation method for a gradient near-equiaxed crystal Cr coating on the surface of a zirconium alloy cladding, comprising the following steps:

1) Pretreatment of the substrate: a Zr-4 alloy tube (the dimensions of which were as follows: the outer diameter was 9.5 mm, the thickness was 0.57 mm, the length was 20 cm, and the components of which were as follows: Zr 98.3%, Sn 1.3%, Fe 0.25%, Cr 0.15%) was prepared; the sample surface was polished with 400 #, 800 #, 1200 #, 2000 #, 3000 # and 4000 # sandpapers in order; then, the sample surface was polished with 9 μm, 3 μm and 1 μm diamond suspensions; finally, the sample was immersed in an acetone solution and ultrasonically cleaned for 15 minutes, taken out and oven-dried, and then placed in a vacuum box for later use;
2) Substrate installation and target pre-sputtering treatment: the pre-treated sample was fixed on a sample table of a chamber of a magnetron sputtering instrument, the chamber of the magnetron sputtering instrument was heated to 320° C., the chamber was vacuumized to $4\times10^{-4}$ Pa, argon gas was introduced into the chamber of the magnetron sputtering instrument until the chamber pressure was 1.3 Pa, and and a Cr target was pre-sputtered for 25 min at a power of 450 W;
3) Argon plasma etching treatment: the substrate was etched for 20 min under the conditions of a temperature of 280° C., an argon gas flow rate of 50 sccm, an ion source current of 1.4 A, and a bias voltage of −110 V;
4) Sputtering Cr coating: a high-power impulse sputtering power supply was started, the pulse frequency was controlled to 400 Hz, the pulse width was controlled to 50 μs, the duty cycle was controlled to 3%, and the sputtering power was controlled to 3200 W. The following parameters were dynamically regulated: the bias voltage was −90~−120 V, the target-substrate distance was 10-20 cm, the sputtering pressure was 0.2-1.0 Pa, the Ar gas flow rate in the tube was regulated to 10-50 sccm, the deposition temperature was 150-420° C., the deposition time for each layer of the coating was 0.5-8 h, the total deposition time was 5-15 h, the thickness of each layer of the coating was 0.5-7 μm, the total coating thickness was 10-15 μm. The specific steps were as follows:

a. Sputtering the first coating: the bias voltage was controlled to −110V, the target-substrate distance was controlled to 15 cm, the sputtering pressure was controlled to 0.3 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 210-220° C., and the deposition was performed for 4.5 h to obtain a fine and dense near-equiaxed crystal structure, i.e., the first coating;
b. Sputtering the second coating: the bias voltage was controlled to −105 V, the Cr target was slowly moved within 1 min by controlling connecting rod with a servomotor, so that the target-substrate distance became 14 cm, and the sputtering pressure was controlled to 1.0 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 10-25 sccm, so that the outer wall temperature of the tube (i.e., the deposition temperature) was maintained at 295-305° C., and the deposition was performed for 4 h to obtain a larger size near-equiaxed crystal structure, i.e., the second coating;
c. Sputtering the third coating: the bias voltage was controlled to −120 V, the Cr target was slowly moved within 1 min by controlling connecting rod with a servomotor, so that the target-substrate distance became 15 cm, and the sputtering pressure was controlled to 0.3 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 210-220° C., and the deposition was performed for 1 h to obtain a fine and dense near-equiaxed crystal structure, i.e., the third coating.

The total deposition time of this example was 9.5 h, and a zirconium alloy sample deposited with a Cr coating was obtained. After testing, the total thickness of the coating was 11.7 μm, wherein the thickness of the first coating was 5.5 μm, the thickness of the second coating was 5.2 μm, and the thickness of the third coating was 1.0 μm. The average grain size of the first coating was 0.22 μm, the average grain size of the second coating was 1.2 μm, and the average grain size of the third coating was 0.27 μm.

Example 4

A preparation method for a gradient near-equiaxed crystal Cr coating on the surface of a zirconium alloy cladding, comprising the following steps:

1) Pretreatment of the substrate: a Zr-4 alloy tube (the dimensions of which were as follows: the outer diameter was 9.5 mm, the thickness was 0.57 mm, the length was 20 cm, and the components of which were as follows: Zr 98.3%, Sn 1.3%, Fe 0.25%, Cr 0.15%) was prepared; the sample surface was polished with 400 #, 800 #, 1200 #, 2000 #, 3000 # and 4000 # sandpapers in order; then, the sample surface was polished with 9 μm, 3 μm and 1 μm diamond suspensions; finally, the sample was immersed in an acetone solution and ultrasonically cleaned for 15 minutes, taken out and oven-dried, and then placed in a vacuum box for later use;
2) Substrate installation and target pre-sputtering treatment: the pre-treated sample was fixed on a sample table of a chamber of a magnetron sputtering instrument, the chamber of the magnetron sputtering instrument was heated to 300° C., the chamber was vacuumized to $4\times10^{-4}$ Pa, argon gas was introduced into the chamber of the magnetron sputtering instrument until the chamber pressure was 0.8 Pa, and a Cr target was pre-sputtered for 15 min at a power of 400 W;
3) Argon plasma etching treatment: the substrate was etched for 20 min under the conditions of a temperature of 280° C., an argon gas flow rate of 50 sccm, an ion source current of 1.2 A, and a bias voltage of −110 V;
4) Sputtering Cr coating: a high-power impulse sputtering power supply was started, the pulse frequency was controlled to 350 Hz, the pulse width was controlled to 50 μs, the duty cycle was controlled to 3%, and the sputtering power was controlled to 2500 W. The following parameters were dynamically regulated: the bias voltage was −90~−120 V, the target-substrate distance was 10-20 cm, the sputtering pressure was 0.2-1.0 Pa, the Ar gas flow rate in the tube was regulated to 10-50 sccm, the deposition temperature was 150-420° C., the deposition time for each layer of the coating was 0.5-8 h, the total deposition time was 5-15 h, the thickness of each layer of the coating was 0.5-7 μm, the total coating thickness was 10-15 μm. The specific steps were as follows:

a. Sputtering the first coating: the bias voltage was controlled to −110 V, the target-substrate distance was controlled to 16 cm, the sputtering pressure was controlled to 0.2 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 225-235° C., and the deposition was performed for 3.5 h to obtain a fine and dense near-equiaxed crystal structure, i.e., the first coating;
b. Sputtering the second coating: the bias voltage was controlled to −90 V, the Cr target was slowly moved within 1 min by controlling connecting rod with a servomotor, so that the target-substrate distance became 12 cm, and the sputtering pressure was controlled to 0.7 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 10-25 sccm, so that the outer wall temperature of the tube (i.e., the deposition temperature) was maintained at 320-340° C., and the deposition was performed for 3 h to obtain a larger size near-equiaxed crystal structure, i.e., the second coating;
c. Sputtering the third coating: the bias voltage was controlled to −120 V, the Cr target was slowly moved within 1 min by controlling connecting rod with a servomotor, so that the target-substrate distance became 18 cm, and the sputtering pressure was controlled to 0.5 Pa, and through the infrared thermometer-Ar gas flow rate controller system, according to the real-time temperature monitoring data of the outer wall of the Zr-4 alloy tube, the Ar gas flow rate in the tube was actively and dynamically adjusted to 25-50 sccm, so that the outer wall temperature of the tube (i.e., the deposition temperature) was maintained at 190-200° C., and the deposition was performed for 1 h to obtain a fine and dense near-equiaxed crystal structure, i.e., the third coating.

The total deposition time of this example was 7.5 h, and a zirconium alloy sample deposited with a Cr coating was obtained. After testing, the total thickness of the coating was 10.8 μm, wherein the thickness of the first coating was 5.2 μm, the thickness of the second coating was 4.8 μm, and the thickness of the third coating was 0.8 μm. The average grain size of the first coating was 0.25 μm, the average grain size of the second coating was 1.6 μm, and the average grain size of the third coating was 0.18 μm.

Comparative Example 1

This comparative example was carried out in the same way as in Example 1, except that in step 4) the bias voltages for sputtering the first coating, the second coating and the third coating were −95 V, −75 V and −90 V respectively, and the other parameters were consistent with those in Example 1. The grain morphology of the obtained coating tended to be a columnar crystal structure, and there was a cracking phenomenon, which did not meet the requirements. The columnar crystal structure of the coating was detrimental to its toughness, rendering it susceptible to cracking and peeling. In addition, the second coating of the coating sample lost the near-equiaxed crystal characteristic, which was not conducive to improving the high-temperature oxidation resistance of the sample.

Comparative Example 2

This comparative example was carried out in the same way as in Example 2, except that in step 4) the target-substrate distances for sputtering the first coating, the second coating and the third coating were 12 cm, 8 cm and 12 cm respectively, and the other parameters were consistent with those in Example 2. The grains of the obtained coating were coarse, and the average grain sizes reached 1.27 μm, 4.5 μm and 1.78 μm respectively, which cannot meet the requirements.

Coarse grains can reduce the toughness and strength of the material because larger grains reduce the number of grain boundaries, which can prevent cracks from expanding. This will cause the coating to crack or fall off more easily when subjected to external forces. In addition, the density of grain boundaries of coarse grains decreases, which is not conducive to the rapid formation of protective $Cr_2O_3$ oxide film on the surface in an oxidizing or corrosive environment, and the protective effect on the substrate decreases.

Comparative Example 3

This comparative example was carried out in the same way as in Example 3, except that in step 4) the sputtering pressures for the first coating, the second coating and the third coating were 0.8 Pa, 1.2 Pa and 0.8 Pa respectively, and the other parameters were consistent with those in Example 3. The obtained coating had poor crystallization effect and poor structure state, which cannot meet the requirements.

Comparative Example 4

This comparative example was carried out in the same way as in Example 4, except that in step 4) the Ar gas flow rates in the tube for sputtering the first coating, the second coating and the third coating were 10-25 sccm, 5-15 sccm and 10-25 sccm respectively, and the deposition temperatures were controlled to 250-280° C., 365-395° C. and 250-280° C. respectively, and the other parameters were consistent with those in Example 4. The average grain sizes of the first, second and third coatings obtained were 0.86 μm, 4.7 μm and 0.75 μm respectively, the grains were coarse, the grain boundary density was reduced, the toughness was reduced, the protectiveness of the coating to the substrate was reduced, and the comparative example also lost the fine and dense near-equiaxed crystal structure characteristics of the first and third coatings, which can not meet the requirements.

Performance Test

The zirconium alloy samples deposited with Cr coating prepared in the above Example 2 and Comparative Example 2 were subjected to high-temperature steam oxidation test. The method was as follows: the high-temperature steam oxidation test was carried out in a horizontal tube furnace equipped with a steam generator, and the temperature was raised from room temperature to a specified temperature of 1200° C. at a heating rate of 10° C./min, and flowing Ar gas (purity of 99.999%) was introduced during the heating process to protect the sample from initial oxidation. When the expected temperature was reached, flowing steam was introduced into the tube at a rate of 2 g/min, and once the steam flow was stable, the sample was placed in the center of the furnace. All samples were kept at 1200° C. for 3600 s and then air-cooled to room temperature.

The results were as follows: the zirconium alloy sample with a Cr coating in Example 2 had excellent resistance to high-temperature steam oxidation, the thickness of $Cr_2O_3$ was thinner and more uniform, there was no peeling phenomenon of oxide film and residual Cr coating after oxidation, and there was no debonding condition at the coating-substrate interface.

Figure 3:
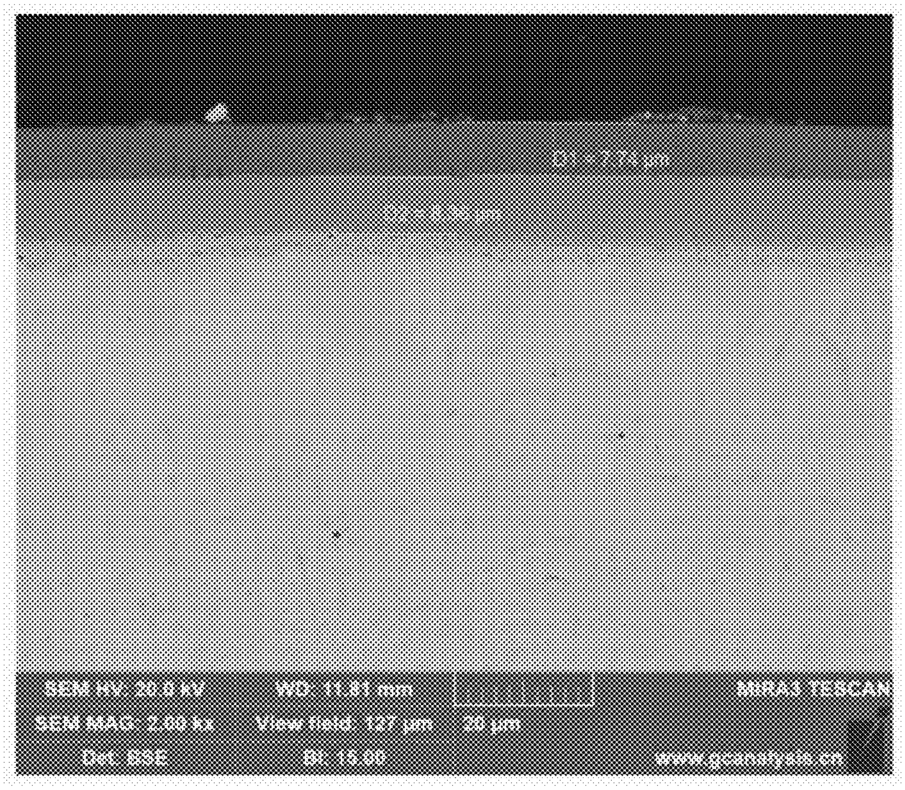
FIG. 3 is a SEM image of a sample prepared in Example 2 after oxidation under high-temperature steam condition at 1200° C. for 3600 s.

FIG. 3 is a SEM image of the sample prepared in Example 2 after oxidation under high-temperature steam condition at 1200° C. for 3600 s. It can be seen from the figure that the thickness of $Cr_2O_3$ after oxidation was 7.74 μm, the thickness of residual Cr was 8.36 μm, the coating thickness was dense and uniform, there was no crack, hole, or peeling phenomenon, and the coating had good protection for the zirconium alloy substrate.

Figure 4:
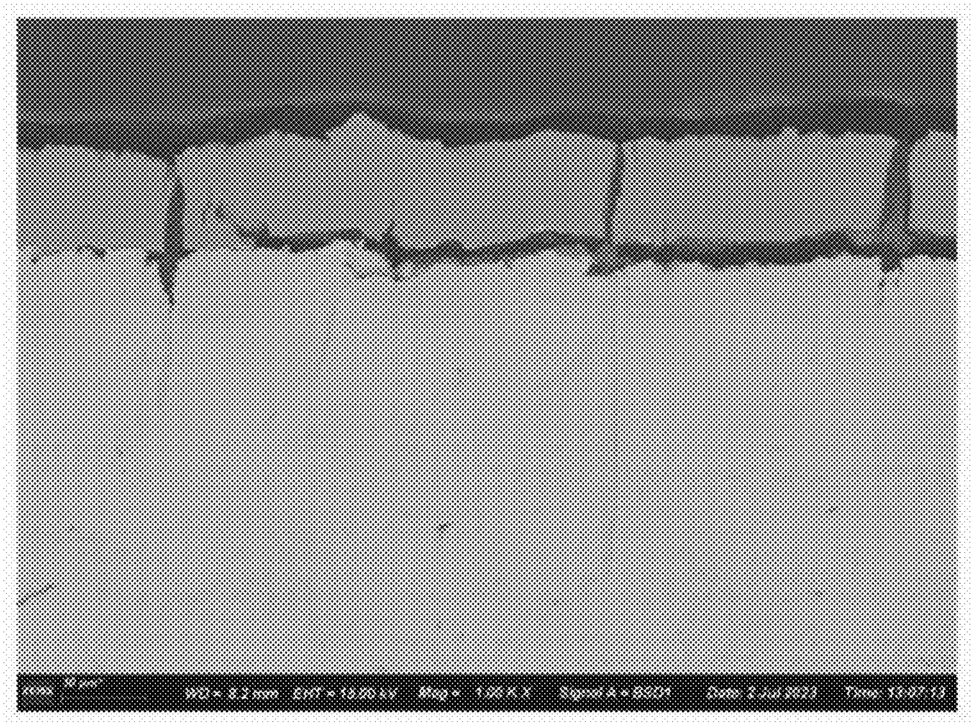
FIG. 4 is a SEM image of a sample prepared in Comparative Example 2 after oxidation under high-temperature steam condition at 1200° C. for 3600 s.

FIG. 4 is a SEM image of the sample prepared in Comparative Example 2 after oxidation under high-temperature steam condition at 1200° C. for 3600 s. It can be seen from the figure that the pure Cr coating had poor toughness, severe cracking and peeling occurred, the Cr coating was completely oxidized to $Cr_2O_3$, and there was no residual Cr coating. The discontinuous oxide layer in the comparative example did not have a protective function and cannot effectively protect the Zr alloy substrate.

The above is merely some specific embodiments of the present application, and the protection scope of the present application is not limited to these embodiments. Modifications or substitutions that can be easily appreciated by those skilled in the art shall all be included within the protection scope of the present application. Thus, the protection scope of the present application should be based on the protection scope of the claims.

What is claimed is:

1. A gradient near-equiaxed crystal Cr coating on a surface of a zirconium alloy cladding, wherein the coating has a near-equiaxed crystal characteristic and is divided into three layers, and has a total thickness of 10-15 μm, wherein a first coating has a grain size of 0.1-0.3 μm and a thickness of 5.0-7.0 μm; a second coating has a grain size of 1-2 μm and a thickness of 4.5-6.8 μm; a third coating has a grain size of 0.1-0.3 μm and a thickness of 0.5-1.2 μm;

a preparation method for the gradient near-equiaxed crystal Cr coating on the surface of a zirconium alloy cladding comprises the following steps:

a pre-treated zirconium alloy substrate is subjected to target pre-sputtering treatment and argon plasma etching treatment, and then a Cr coating is sputtered to obtain the gradient near-equiaxed crystal Cr coating on the surface of a zirconium alloy cladding;

wherein during the process of sputtering the Cr coating, a three-layer coating with different grain sizes is obtained by the following strategy:

A. regulating a bias voltage: when preparing the first coating or the third coating, the bias voltage is regulated to −110 ∼−120 V; when preparing the second coating, the bias voltage is regulated to −90 V ∼−110 V;

B. regulating a target-substrate distance: when preparing the first coating or the third coating, the target-substrate distance is 15-20 cm; when preparing the second coating, the target-substrate distance is 10-15 cm;

C. regulating a sputtering pressure: when preparing the first coating or the third coating, the sputtering pressure is 0.2-0.6 Pa; when preparing the second coating, the sputtering pressure is 0.6-1.0 Pa;

D. regulating an argon gas flow rate in a tube and tube wall temperature: when preparing the first coating or the third coating, the argon gas flow rate into the tube is controlled to 25-50 sccm, so that the tube wall temperature is regulated to 150-260° C.; when preparing the second coating, the argon gas flow rate into the tube is controlled to 10-25 sccm, so that the tube wall temperature is regulated to 260-420° C.

2. The gradient near-equiaxed crystal Cr coating on the surface of a zirconium alloy cladding according to claim 1, wherein when sputtering the first coating, the deposition time is 2.5-8 h; when sputtering the second coating, the deposition time is 2-6 h; when sputtering the third coating, the deposition time is 0.5-1 h.

3. The gradient near-equiaxed crystal Cr coating on the surface of a zirconium alloy cladding according to claim 1, wherein a pretreatment method is as follows: 400 #, 800 #, 1200 #, 2000 #, 3000 # and 4000 # sandpapers are used to polish a surface of the zirconium alloy substrate in sequence, and then 9 μm, 3 μm and 1 μm diamond suspensions are used to polish the surface of the zirconium alloy substrate in sequence; finally, the zirconium alloy substrate is immersed in an acetone solution and ultrasonically cleaned for 10-20 min, taken out and oven-dried, and placed in a vacuum box for later use.

4. The gradient near-equiaxed crystal Cr coating on the surface of a zirconium alloy cladding according to claim 1, wherein during the process of target pre-sputtering treatment, a temperature of a chamber of a magnetron sputtering instrument is 200-350° C., a chamber vacuum degree is $3\times10^{-4}$-$5\times10^{-4}$ Pa, high-purity argon is introduced so that a chamber pressure is 0.8-1.5 Pa, a power is 200-500 W, and a sputtering time is 10-25 min.

5. The gradient near-equiaxed crystal Cr coating on the surface of a zirconium alloy cladding according to claim 1, wherein during the process of argon plasma etching treatment, a temperature for argon plasma etching treatment is 200-350° C., an argon gas flow rate for argon plasma etching treatment is 40-60 sccm, an ion source current for argon plasma etching treatment is 0.5-2 A, a bias voltage for argon plasma etching treatment is −50 ∼−200V, and an etching time is 10-30 min.

6. The gradient near-equiaxed crystal Cr coating on the surface of a zirconium alloy cladding according to claim 1, wherein during the process of sputtering the Cr coating, a pulse frequency is 200-500 Hz, a pulse width is 20-80 μs, a duty cycle is 1%-4%, a sputtering power is 2000-4000 W, a deposition temperature for sputtering the Cr coating is 150-420° C., and a deposition time is 5-15 h.

7. The gradient near-equiaxed crystal Cr coating on the surface of a zirconium alloy cladding according to claim 1, wherein the gradient near-equiaxed crystal Cr coating is configured to improve a high-temperature service performance of a zirconium alloy cladding tube.

* * * * *